United States Patent [19]
Boulic

[11] Patent Number: 6,081,151
[45] Date of Patent: Jun. 27, 2000

[54] ELECTRONICALLY CONTROLLED VARIABLE ATTENUATOR

[75] Inventor: Claude Boulic, Paray Vielle Poste, France

[73] Assignee: Lucent Technologies, Inc., Murray Hill, N.J.

[21] Appl. No.: 09/083,166

[22] Filed: May 22, 1998

[30] Foreign Application Priority Data

May 23, 1997 [FR] France ................................ 97 06558

[51] Int. Cl.[7] ...................................................... H03L 5/00
[52] U.S. Cl. .......................... 327/308; 327/325; 327/583
[58] Field of Search .................................. 327/308, 325, 327/583

[56] References Cited

U.S. PATENT DOCUMENTS

| | | | |
|---|---|---|---|
| 3,663,900 | 5/1972 | Peterson ................................ | 333/81 R |
| 4,047,131 | 9/1977 | Ludikhuize ............................ | 333/81 R |
| 4,220,874 | 9/1980 | Iwata et al. ............................ | 307/256 |
| 4,369,414 | 1/1983 | Aoki et al. ............................. | 333/81 R |
| 4,668,882 | 5/1987 | Matsuura .............................. | 307/540 |
| 5,140,200 | 8/1992 | Stanton ................................. | 307/540 |
| 5,300,900 | 4/1994 | Bellantoni ............................. | 333/17.2 |

Primary Examiner—Jeffrey Zweizig

[57] ABSTRACT

The present invention relates to a variable power-attenuation circuit whose attenuation is controlled electronically by a control voltage (Vc). This circuit includes resistive elements (R20, R21, D20, D21) of which at least two resistive elements are diodes (D20, D21), and a biasing device intended to set the direct current passing through the diodes. This circuit is characterized in that the biasing device includes means for independently setting the characteristic impedance of the circuit, the size of the dynamic range of the control voltage (Vc) and the position of the said dynamic range.

Application to the production of transmission devices for directional radio.

5 Claims, 2 Drawing Sheets

ELECTRONICALLY CONTROLLED VARIABLE ATTENUATOR

FIELD OF THE INVENTION

The present invention relates to a variable power-attenuation circuit whose attenuation is controlled electronically by a control voltage. The application of the invention is more particularly, but not exclusively, found in the production of reception devices for directional radio.

BACKGROUND OF THE INVENTION

Attenuators are passive circuits commonly used to introduce a power loss between a source circuit and a load circuit. Their purpose is to match the power level received by the load circuit. They are also sometimes used as an impedance matching circuit.

The most well-known attenuator structures are T, π and bridged-T structures. T and π structures include three impedances, each mounted on one branch of the structure. The value of these impedances will determine the attenuation generated by the structure as well as its characteristic impedance. For its part, the bridged-T structure comprises four impedances. It is a variant of the T structure. It actually comprises an additional impedance which shunts the two impedances of the upper branches of the T.

In order for the attenuation produced by this type of circuit to be electronically variable, it is conventional to use PIN diodes as a variable impedance. The variation in the impedance of a diode is obtained by modifying the direct current which passes through it. In order to obtain variable attenuation, the T, π or bridged-T structure is therefore supplemented by a biasing device intended to set the direct current flowing in the diodes of the structure. An example of a variable attenuation circuit is described in FIG. 1.

This embodiment example is derived from a π structure. It therefore includes three diodes, one diode D12 on the series branch of the π and two diodes D10 and D11 on the two parallel branches of the π. Resistors R10, R11 and R12 are provided in order to make a direct current flow through the diodes D10 and D11. The anode of the diode D10 is therefore connected to a supply terminal Vcc of the circuit via the resistor R10, its cathode is connected to the anode of the diode D11 via the resistor R11 and the cathode of the diode D11 is earthed through the resistor R12. The value of the direct current flowing in the diodes D10 and D11 is therefore fixed by these three resistors. In order to channel the direct current in the current path R10, D10, R11, D11, R12, the circuit includes decoupling capacitors. A first decoupling capacitor C10 is inserted between the input of the circuit and the anode of the diode D10; a second capacitor C11 is inserted between the cathode of the diode D10 and earth; a third capacitor C12 is inserted between the anode of the diode D11 and earth; a fourth capacitor C13 is inserted between the cathode of the diode D11 and the output of the circuit; lastly, a fifth capacitor C14 is inserted between the input of the circuit and the anode of the diode D12. In order to control the attenuation of the circuit electronically, a control voltage Vc is applied on a control input INc of the circuit. This control input is connected to the anode of the diode D12 via a resistor R13 in series with an induction coil L10. The induction coil L10 makes it possible to decouple the control input INc with the rest of the circuit in alternating mode. In order to improve this decoupling, a capacitor C15 is inserted between the coil and earth.

This attenuator circuit operates in the following way: the direct current flowing in the diodes D10 and D11 is fixed by the resistors R10, R11, R12, and is chosen so as to set the impedance of the diodes D10 and D11 to the desired value, and consequently to set the characteristic impedance and the maximum attenuation of the circuit. The control voltage Vc governs the conduction state of the diode D12. So long as the voltage on the anode of the diode D12 is less than (R12*Vcc)/(R10+R11+R12), the diode D12 is off and the attenuation A is a maximum. Above this value, the diode D12 is on and the attenutation decreases. An example of an attenuation curve of the circuit as a function of the control voltage is illustrated in FIG. 2.

An attenuated circuit of this type is defined by various parameters:
 its characteristic impedance;
 the size of the dynamic range of its control voltage; and
 the position of this range.

In the example in FIG. 2, for a maximum circuit attenuation of 12 decibels, the slope of the curve is −3 decibels per volt, the size of the dynamic range of the control voltage Vc is 4 volts, and this range is centred on the value Vc=5 volts. The size and the central point of this dynamic range make it possible to determine its position.

The main drawback of this type of circuit resides in the setting of these various parameters. Indeed, the system of equations belonging to this circuit shows that these parameters are correlated with one another. The result of this is that it is not possible to choose the value of certain parameters independently of the others.

Another drawback resides in the fact that the resistors R10 and R12 used to fix the direct current in the diodes D10 and D11 modify the AC behaviour of the basic circuit, namely the p structure. In order to limit their effects in AC mode, they are generally chosen in a certain interval of values. This will impose an additional condition for setting the circuit parameters.

SUMMARY OF THE INVENTION

The object of the invention is to overcome some or all of the aforementioned drawbacks.

The invention therefore relates to a variable power-attenuation circuit whose attenuation is controlled electronically by a control voltage, which circuit includes resistive elements of which at least two resistive elements are diodes, and a biasing device intended to set the direct current passing through the diodes, characterized in that the biasing device includes means for independently setting the characteristic impedance of the circuit, the size of the dynamic range of the control voltage and the position of the said dynamic range.

According to a particular embodiment of the invention, the variable attenuation circuit includes two resistors mounted in series between a signal input and an output of the circuit, a first diode mounted in parallel with the said resistors and connected between the signal input and the output of the circuit, and a second diode connected between the midpoint of the two resistors and earth, and the biasing device consists of a differential pair, a first branch of which is connected to the cathode of the first diode and a second branch of which is connected to the cathode of the second diode, the anode of the said first diode being connected to a continuous supply terminal, the said differential pair being supplied by a variable current source in order to set the characteristic impedance of the attenuator circuit and receiving, on a first input, a reference voltage intended to position the dynamic range of the control voltage of the circuit and, on a second input, the control voltage by means of a first bridge of variable resistors, which first resistor bridge is intended to set the size of the dynamic range of the control voltage.

BRIEF DESCRIPTION OF THE DRAWINGS

Other characteristics and advantages of the invention will become apparent on reading the following detailed description, which is given with reference to the appended drawings, in which.

DETAILED DESCRIPTION

Figure 1:
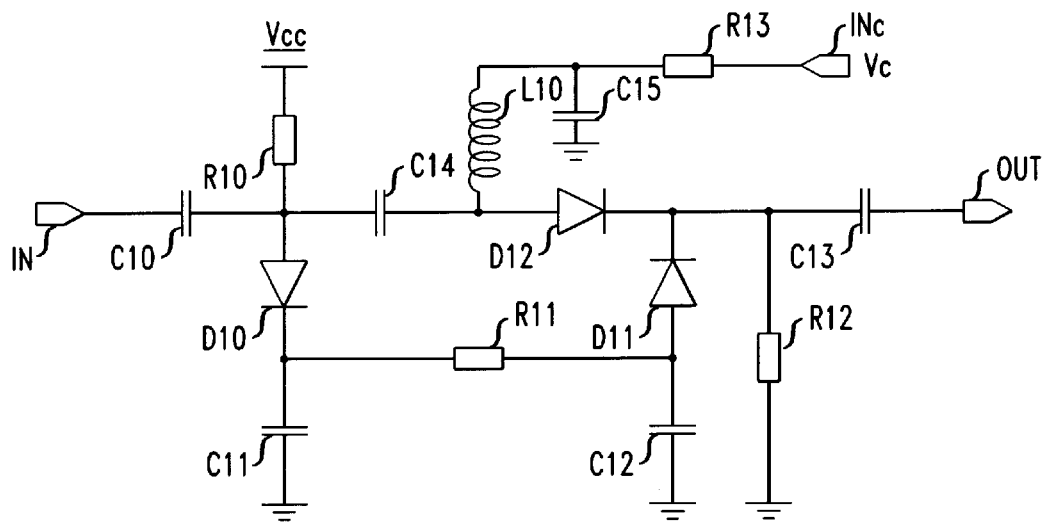
FIG. 1, already described, represents a diagram of a known variable attenuation circuit.
Figure 2:
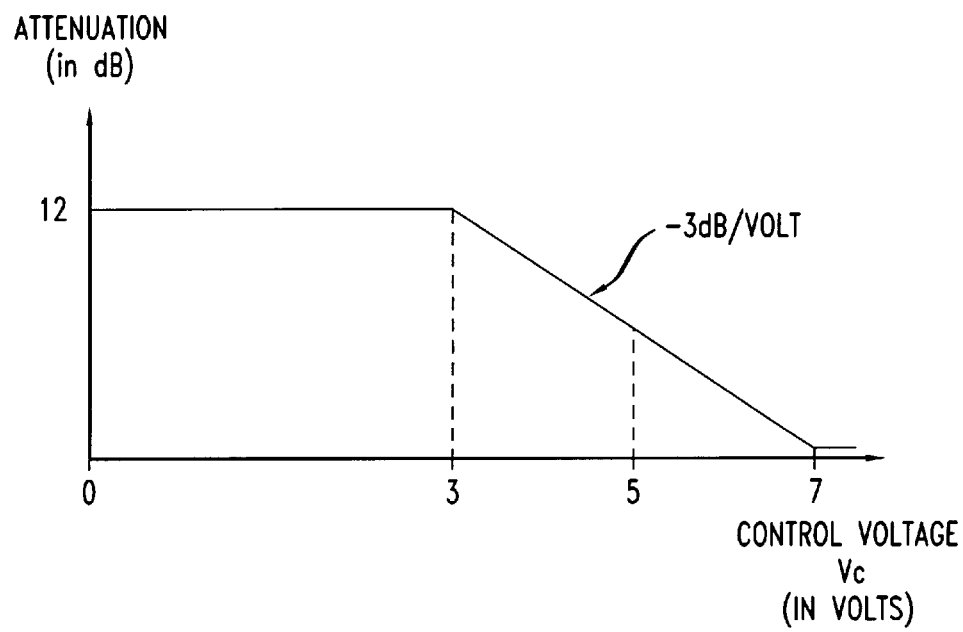
FIG. 2, already described, represents a curve of the attenuation of a variable attenuator circuit as a function of its control voltage.
Figure 3:
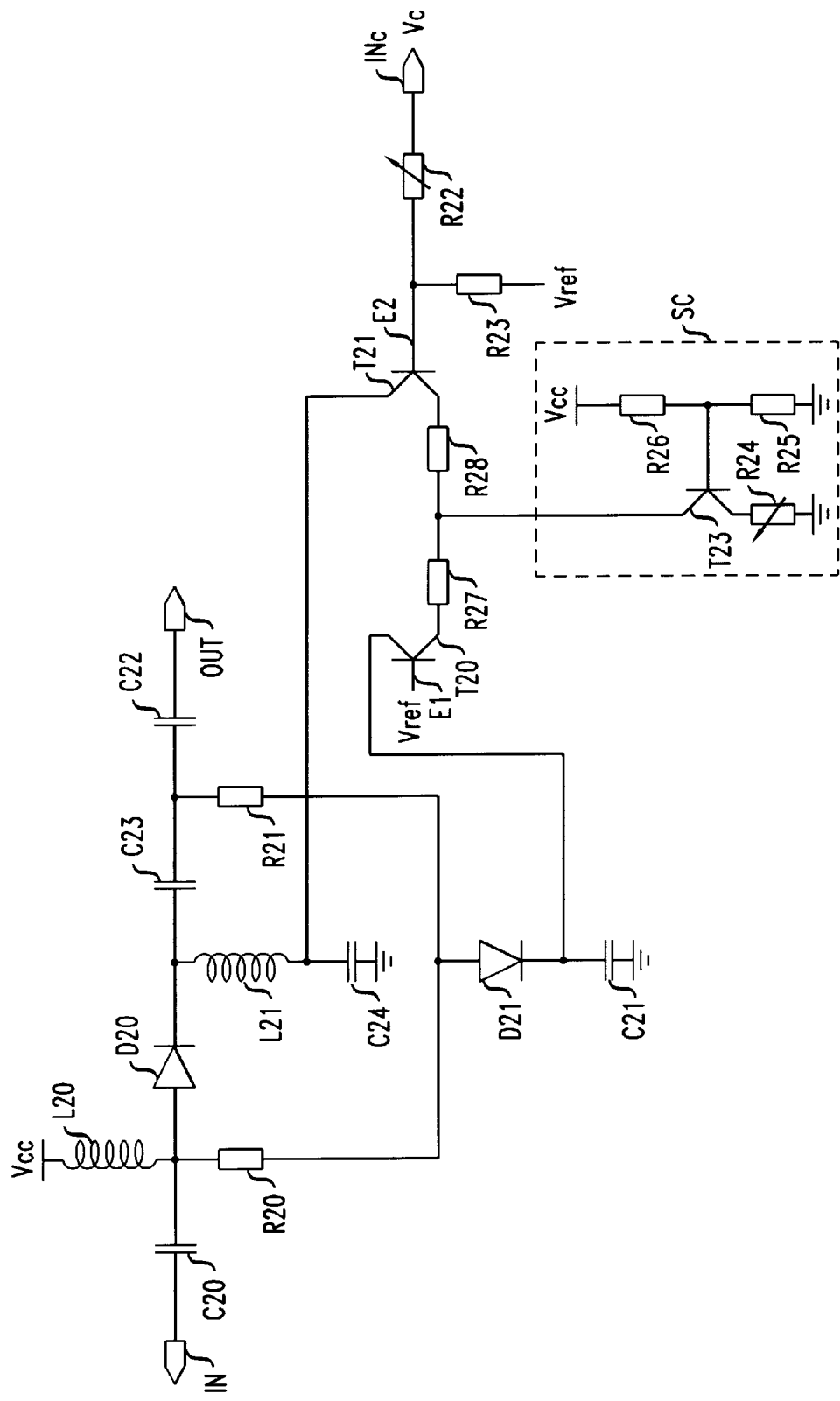
FIG. 3 is a diagram of a variable attenuator circuit according to the invention.

The circuit in FIG. 3 includes first of all a signal input IN, a signal output OUT and a control input INc on which the control voltage Vc is applied. The basic structure of this circuit is a bridged-T structure composed of two resistors R20 and R21 mounted in series between the input and the signal output of the circuit, a diode D20 mounted in parallel with the said resistors and a diode D21 connected between the midpoint of the resistors and earth.

In order to impose a direct current in the diodes D20 and D21, the circuit is supplemented by a biasing device. This biasing circuit comprises a differential pair consisting of the bipolar transistors T20 and T21. The collector of the transistor T20 is connected to the cathode of the diode D21, whereas the collector of the transistor T21 is connected to the cathode of the diode D20 via an induction coil L21. The two branches of the differential pair are supplied with voltage by a voltage source Vcc which is connected to the anode of the diode D20 via an induction coil L20. The coils L20 and L21 have the role of cutting the alternating signal. The circuit also includes decoupling capacitors for channelling the direct current imposed by the differential pair. To do this, a decoupling capacitor C20 is inserted between the signal input IN and the anode of the diode D20; a capacitor C21 is inserted between the cathode of the diode D21 and earth; a capacitor C22 is inserted between the resistor R21 and the signal output OUT; a capacitor C23 is inserted between the anode of the diode D20 and the resistor R21; lastly, a capacitor C24 is inserted between the induction coil L21 and earth.

The differential pair is supplied with current by a variable current source SC. Feedback resistors R27 and R28 are provided on the emitters of the transistors T20 and T21 in order better to control the proportion of current flowing in each of the branches. Thus, if these two resistors are equal and if an identical voltage is applied on the bases of the transistors T20 and T21, an identical current passes through both branches of the differential pair. Since the direct current flowing in the diodes D20 and D21 fixes the dynamic resistance of these two diodes, the variable current source therefore makes it possible to set the characteristic impedance of the circuit. In the example in FIG. 3, the variable current source SC includes a transistor T23, the collector of which is connected to the midpoint of the feedback resistors R27 and R28, the emitter of which is earthed via a variable resistor R24 intended to vary the value of the current delivered by the source, and the base of which is connected to the midpoint of a bridge of resistors R25, R26 which is connected between the supply terminal Vcc of the circuit and earth.

A reference voltage Vref is applied on one differential pair input E1. This input is connected to the base of the transistor T20. This voltage will make it possible to set the position of the dynamic range of the control voltage. To be precise, as the reference voltage Vref increases, the voltage applied on the other input E2 of the differential pair will have to increase. Since the voltage applied on the input E2 is a fraction of the control voltage Vc, it is easy to understand that this voltage must be higher in order to obtain identical attenuation.

Lastly, the control voltage Vc is applied on the base of the transistor T21, which constitutes the input E2, via a variable resistor bridge. This resistor bridge consists of a variable resistor R22 mounted in series with a fixed resistor R23, the combination being connected between the reference voltage Vref and the control voltage Vc. The midpoint of the resistor bridge is connected to the base of the transistor T21. The value of the resistor R22 will affect the slope of the attenuation curve, and will consequently affect the size of the dynamic range of the control voltage Vc.

The attenuator of the invention is set in the following way: the characteristic impedance of the circuit is firstly set using the variable current source. The position of the dynamic range of the control voltage Vc is then set by choosing the voltage value Vref. Lastly, the slope of the attenuation curve is set by means of the resistor R22.

What is claimed is:

1. A variable attenuation circuit connected between a signal input and an output, characterized in that it includes two resistors mounted in series between the signal input and the output of the circuit, a first diode mounted in parallel with the said resistors and connected between the signal input and the output of the circuit, and a second diode connected between a midpoint node between the two resistors and earth, and in that a biasing device consist of a differential pair of transistors, a first branch of which is connected to the cathode of the first diode and a second branch of which is connected to the cathode of the second diode, the anode of the said first diode being connected to a continuous supply terminal, the differential pair of transistors being supplied by a variable current source in order to set the characteristic impedance of the attenuator circuit and receiving, on a first input, a reference voltage intended to position a dynamic range of a control voltage of the circuit and, on a second input, the control voltage by means of a first bridge of resistors, which first resistor bridge is intended to set the size of the dynamic range of the control voltage.

2. The variable attenuation circuit according to claim 1, characterized in that a pair of feedback resistors, which are connected in series to form a midpoint node therebetween, are connected between the emitters of the differential pair of transistors, with the midpoint node connected to the variable current source.

3. The variable attenuation circuit according to claim 2, characterized in that the variable current source includes a current source transistor, the collector of which is connected to the midpoint node of the pair of feedback resistors, the emitter of which is earthed through a first variable resistor operable to vary the value of the current of the variable current source, and the base of which is connected to a node between a second bridge of series resistors which is connected between the supply terminal of the circuit and earth.

4. The variable attenuation circuit according to claim 1, characterized in that the first bridge of resistors consists of a second variable resistor mounted in series with a third fixed resistor, the combination being connected between the reference voltage and the control voltage and the mid-point of the said resistor bridge being connected to the second input of the differential pair.

5. The variable attenuation circuit according to claim 3, characterized in that the first bridge of resistors consists of a second variable resistor mounted in series with a third fixed resistor, the combination being connected between the reference voltage and the control voltage and the midpoint of the said resistor bridge being connected to the second input of the differential pair.

\* \* \* \* \*